United States Patent [19]

McClain et al.

[11] 4,031,317

[45] June 21, 1977

[54] DATA COMMUNICATIONS SYSTEM WITH IMPROVED DIGITAL PHASE-LOCKED LOOP RETIMING CIRCUIT

[75] Inventors: Herbert D. McClain, Quaker City; Bipin D. Parikh; John K. Burkey, both of Cambridge, all of Ohio

[73] Assignee: NCR Corporation, Dayton, Ohio

[22] Filed: Feb. 12, 1976

[21] Appl. No.: 657,425

[52] U.S. Cl. .................. 178/69.1; 328/133; 328/155

[51] Int. Cl.[2] .................. H04L 7/02

[58] Field of Search .......... 325/13; 178/53, 69.5 R, 178/70 R; 179/15 BS; 328/63, 72, 133, 155; 340/146.1 D, 147 SY; 329/122

[56] References Cited

UNITED STATES PATENTS

| | | | |
|---|---|---|---|
| 3,757,051 | 9/1973 | Girard et al. | 178/70 R |
| 3,953,674 | 4/1976 | Fletcher | 178/69.5 R |

*Primary Examiner*—Benedict V. Safourek
*Attorney, Agent, or Firm*—J. T. Cavender; Wilbert Hawk, Jr.; Jeffrey P. Morris

[57] ABSTRACT

A digital timing recovery circuit is disclosed for synchronously transmitting digitally encoded data in a multiterminal configuration between a data processor and a plurality of data terminals associated therewith.

Phase shifted synchronous data from the data processor is continuously compared with a newly generated synchronous clock generated at a repeater interposed along the communication line for minimization of the time differential between the retiming clock and the transmitted data. The data transitions enable a digitally implemented one-shot, which generates pulses, the leading edges of which pulses enable a difference counter, while the leading edges of the retiming clock pulses disable the counter. The difference counter output is sampled in a digital phase locked loop to derive the number of cycles of a stable oscillator which occur between the two aforementioned leading edges of the generated pulses. A difference of less than a predetermined count such as two, results in no correction of the retiming clock, a difference count greater than such predetermined amount, such as a count of three through seven, advances the clock by adding a pulse to the retiming clock, and a difference of more than a predetermined number of counts, such as eight, retards the clock by subtracting a pulse from the retiming clock. Thus, continuous digital adjustment of the synchronous clock is provided to maintain the counter difference below a predetermined count, such as two, which serves to resynchronize bit-shifted data with the retiming clock for retransmission into the communications channel.

48 Claims, 8 Drawing Figures

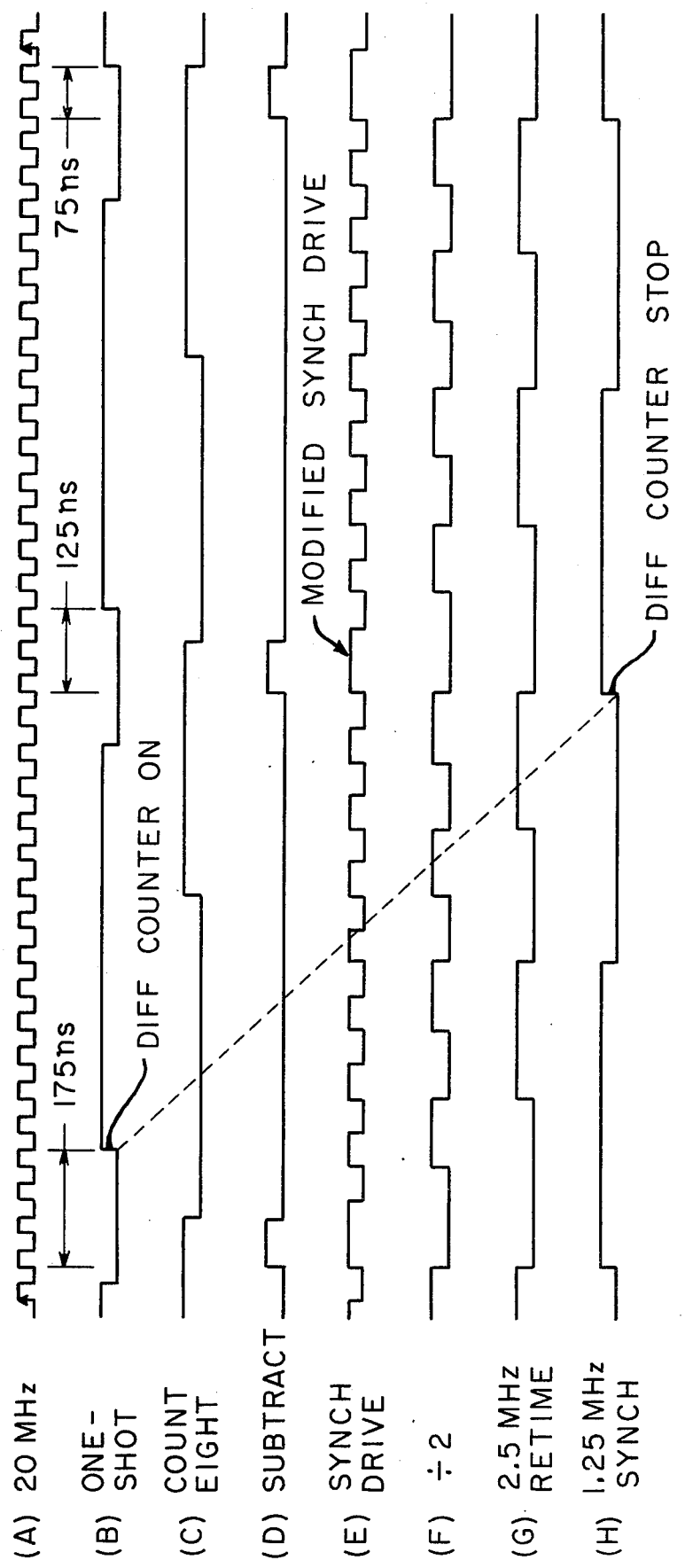

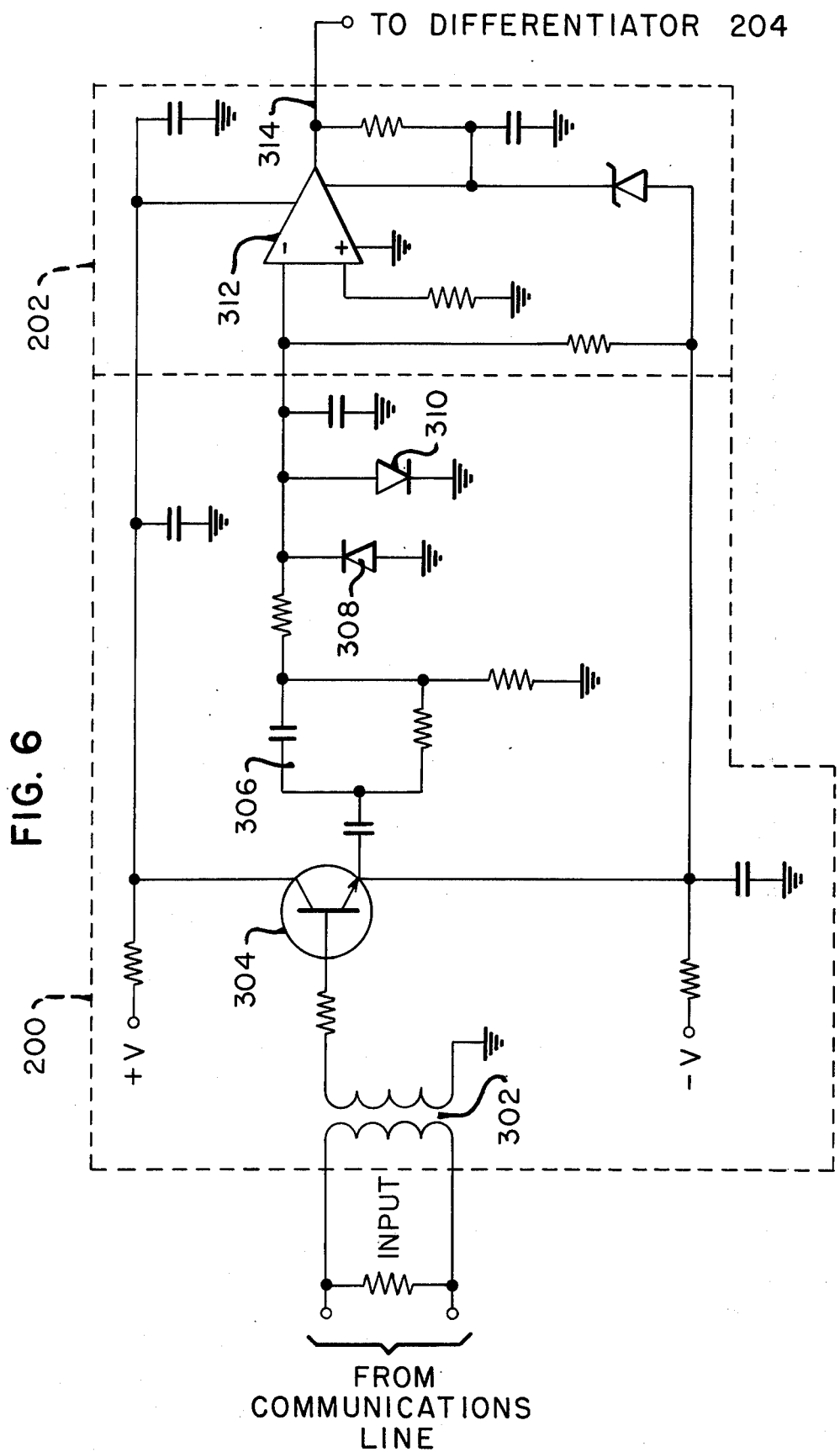

DATA COMMUNICATIONS SYSTEM WITH IMPROVED DIGITAL PHASE-LOCKED LOOP RETIMING CIRCUIT

CROSS-REFERENCE TO RELATED APPLICATION

The present invention references and relates to an application entitled Data Comunications System With Improved Asynchronous Retiming Circuit, NCR Docket No. 2220, Ser. No. 657,426, filed on even date herewith of H. D. McClain, B. D. Parikh and J. K. Burkey, and assigned to the same assignee as the present invention.

BACKGROUND OF THE INVENTION

1. Field of the Invention

The present invention relates generally to the synchronous transmission and synchronization of digitally encoded data between a central processor and a plurality of terminals or other computer and associated peripheral equipment for utilizing or operating with such transmitted data. More specifically, the invention relates to a system for extending the allowable transmission line length between a computer and its associated terminal devices beyond the length possible with systems of the prior art.

When digitally encoded data, in whatever format, such as phase encoded, sometimes referred to as Manchester encoding, NRZ, or other known code is transmitted over a transmission line, the phase error between the data transitions and the system clock increases with increasing transmission line distance until the resultant bit-shift results in loss of synchronization between the clock and data and errors in the transmitted data. The terms phase shift, bit shift and peak shift are used interchangeably herein to described the well known phenomena of the shifting of data transitions during transmission. The present invention relates to a technique for retiming the data at some point or points along the transmission line with a newly generated retiming clock which is phase adjustable with the incoming data, and for retransmitting the retimed data along the transmission line, thereby extending the distance possible between a central processor and its terminals by substantially reducing the phase shift errors which would otherwise occur in transmission.

An exemplary application for such a retiming system is a central processor from which data is coupled to a plurality of electronic cash registers, as for example, in a department store.

2. Description of the Prior Art

Many communications systems are known in the prior art for transmitting digital data serially, in parallel, synchronously and asynchronously between a computer and its associated peripheral equipment. While such data may usually be synchronously transmitted from the computer to the peripheral equipment, data from the peripherals, in multi-byte format, is generally asynchronously transmitted to the computer, since the time or origin of such data is usually random and intermittent. The present invention relates to an improved synchronous transmission system for retiming and retransmitting synchronous data.

A typical communication system for the prior art illustrative of synchronous data communication between a central computer and its data terminals is disclosed by U.S. Pat. No. 3,676,846. A plurality of prior art repeaters in a trasmission line for transmitting pulsed information is disclosed by U.S. Pat. No. 3,072,744. Another repearter technique for a bidirectional communication system is disclosed by U.S. Pat. No 3,040,130. A serial loop data transmission system is disclosed by U.S. Pat. No. 3,633,166. A multi-clock timing control for a multiprocessor system is disclosed by U.S. Pat. No. 3,715,729. None of the above-identified prior art patents utilize the digital phase locked loop resynchronization and transmission line extension techniques of the present invention wherein correction pulses are either added or substracted from the retiming clock in accordance with a continuous digital comparison of the retiming clock and the data transitions, with such correction dependent upon the detected phase error exceeding a predetermined digital value.

SUMMARY OF THE INVENTION

The present invention relates to an improved synchronous communications system including a unique timing recovery technique for extending the allowable transmission line distance between a computer or data processor and another computer or terminal devices, over which distance data is transmitted. One or more novel repeaters are inserted at various points on the line over which data is transmitted. The transmitted data is retimed by a unique digital phase locked loop circuit wherein data transitions are continuously compared with a newly generated synchronous timing signal and continuously adjusted to minimize, or hold to a predetermined value, the time differential therebetween. A derived digital count indicative of the phase shift of the data transitions with respect to the retiming clock is used to modify the retiming clock to maintain synchronization.

It is accordingly an object of the invention to provide an improved data communication system for the transmission of digitally encoded data between a computer and its associated data terminal devices.

It is another object of the invention to provide an improved data transmission system for increasing the transmission line length over which digitally encoded data may be effectively transmitted from a data processor to another data processor or terminal without undue bit-shift.

It is yet another object of the present invention to provide a repeater for insertion in the path of transmission between a data source and a data destination for increasing the allowable distance such data may be transmitted.

It is yet another object of the present invention to provide a timing recovery system utilizing a digital phase-locked loop for synchronously retiming digital data for retiming with a newly generated clock, It is yet another object of the present invention to provide an improved digital modem for correcting bit-shift errors which may occur in synchronous data during transmission of such data in a communications channel.

The aforementioned, and other objects, features and advantages of the invention will be apparent with reference to the following detailed description of the preferred embodiments thereof, taken in connection with the accompanying drawings wherein:

BRIEF DESCRIPTION OF THE DRAWINGS

FIGS. 4(A) through 4(H) are various waveform diagrams illustrative of another retiming operation of the retiming circuit described with reference to FIG. 2 wherein the retiming clock phase is retarded.

FIG. 6 is a schematic diagram of a receiver utilized in connection with the invention.

DESCRIPTION OF THE PREFERRED EMBODIMENT

Figure 1:
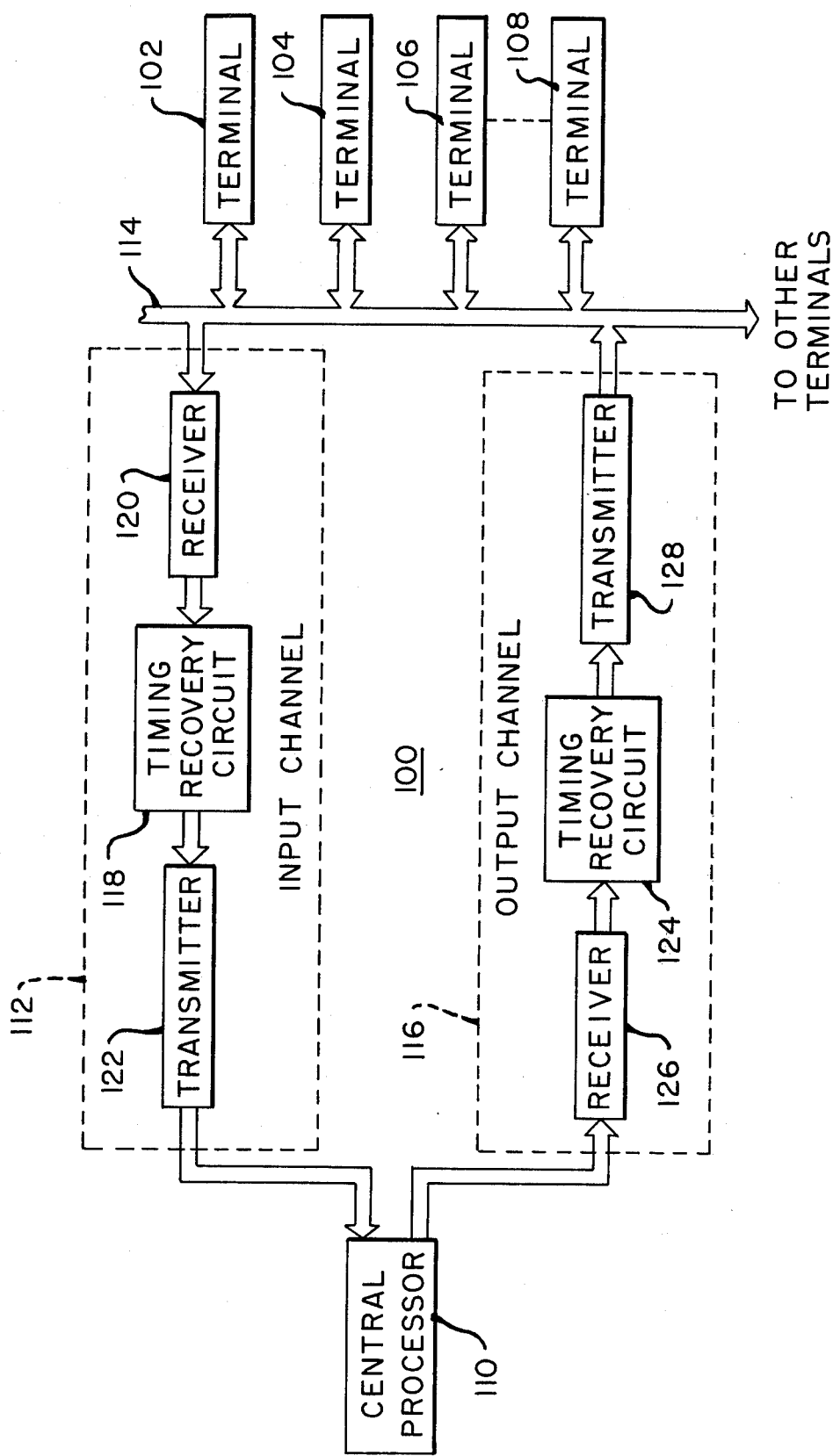
FIG. 1 is a simplified block diagram of a data communications system embodying the digital phase locked loop timing recovery technique of the present invention.

Referring now to FIG. 1, a simplified block diagram illustrative of a typical multi-terminal configuration in which the present invention is utilized is shown generally at 100. A plurality of data terminals 102, 104, 106 and 108, at a plurality of spaced locations remote from a central processor 110, may comprise electronic cash registers, electronic funds transfer equipment, or any peripheral equipment capable of generating digital terminal to processor message and of receiving processor to terminal messages over a communication line. In accordance with the present invention, the allowable data communication line distance between the terminals 102 through 108 and the central processor 110 is extended beyond the distance of such data communication lines of the prior art, for example, beyond 1500 feet, without loss of data, excess noise, loss of system timing, bit-shift or other transmission line anomalies. The central processor 110 may comprise an NCR 751-600 Data Concentrator or other computer, while the number of terminal or peripheral locations is illustrative only, as any number of terminals may be coupled, in either a polling or common bus configuration to the central processor, dependent only upon the system software. An asynchronous input channel 112 relays data originating at the various terminal locations and coupled from a common bus 114 to the central processor after retiming, while a synchronous output channel 116 relays data originating at the central processor 110 to the terminals, also after retiming. Each channel includes a timing recovery circuit for retiming the data coupled thereto and retransmitting the data to either the central processor 110 or to a designated terminal. The timing recovery circuits functions as repeaters, are transparent to the data flow, and receive, asynchronously in the input channel and synchronously in the output channel at a predetermined rate of, for example, 1.25 megabits per second. The timing recovery circuit 118 described with reference to the input channel 112 and its associated receiver 120 and transmitter 122 are the subject of copending United States patent application Ser. No. 657,426, NCR Docket No. 2220, wherein the details thereof are disclosed. Generally, the input channel 112 retransmits forty-bit Manchester encoded (phase encoded) characters (including preamble and synch character) asynchronously at 40–100 microsecond intervals at 1.25 megabit/second over a twisted-pair communication cable at an error rate of less than one bit per $10^9$ bits transmitted. Of course, other character word lengths and timing intervals may be employed.

The output channel 116, embodying the present invention, includes a synchronous repeater timing recovery circuit 124 and its associated receiver 126 and transmitter 128 for continuously receiving, retiming and retransmitting Manchester or other digitally encoded data to the terminals from the central processor 110. For purposes of the present invention, input channel 112 completes the data transmission loop between the central processor 110 and its associated terminal devices.

Figure 2:
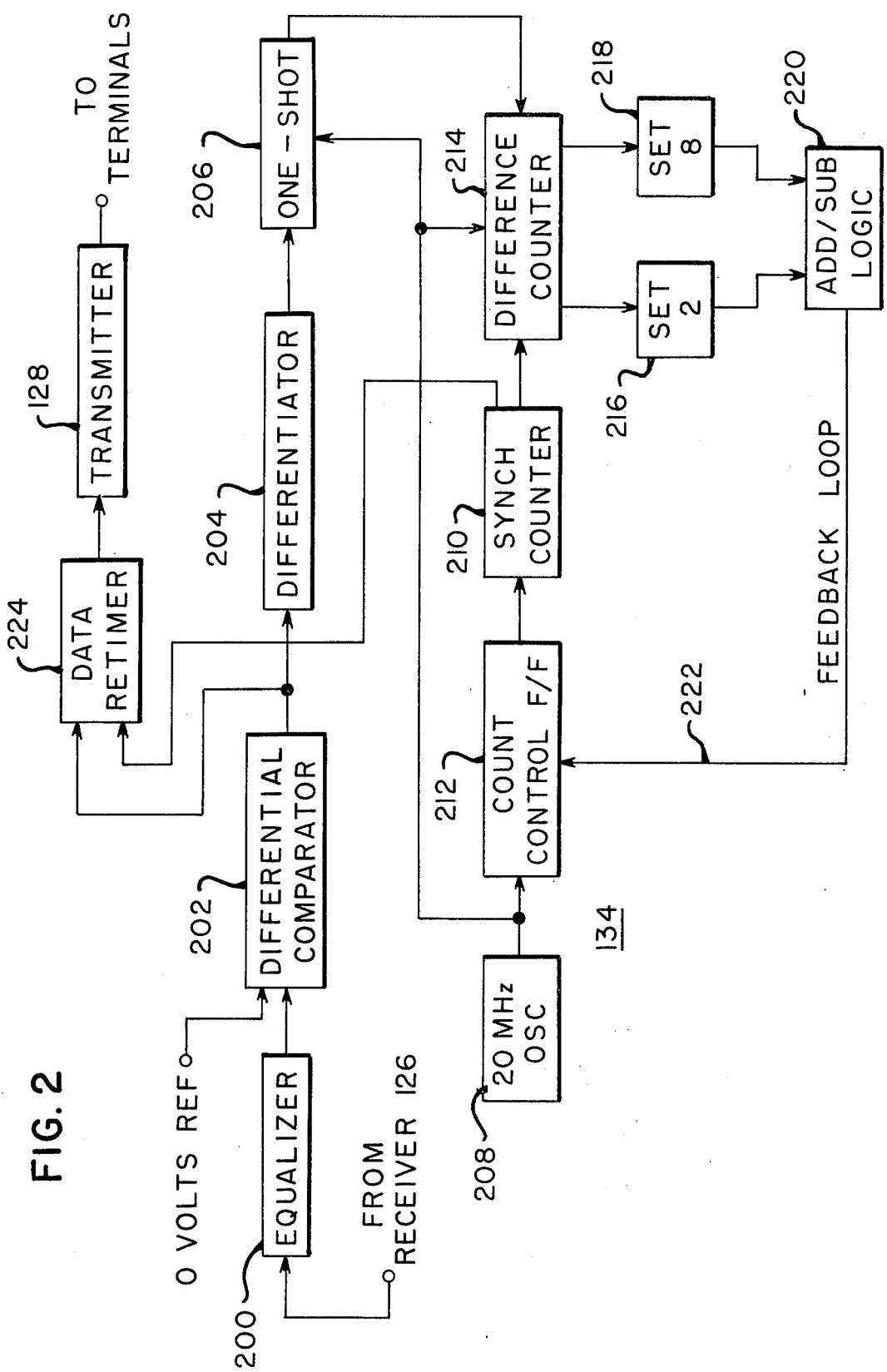
FIG. 2 is a block diagram of the bit-timing recovery and synchronization circuit of the present invention.

Referring now to FIG. 2, the timing recovery circuit 124 is illustrated. Data at a suitable transmission frequency such as 1.25 MHz from the central processor 110 is coupled from receiver 126, which has internal terminations to match the characteristic impedance of the transmission line, to an amplitude equalizer circuit 200. Amplitude equalizer 200, described in greater detail with reference to FIG. 6, compensates for the frequency attenuation characteristics of a nominal transmission line and includes a low-pass filter for reducing high frequency out-of-band noise. The output of equalizer 200, an equalized amplitude data waveform in Manchester format is coupled to a zero-crossing detector, such as differential comparator 202, having a zero volt reference level and an output which switches when the bi-polar input signal from equalizer 200 passes within several millivolts of the zero reference. The comparator input signal is preferably biased to compensate for any dissymmetry between the comparator output and the TTL circitry to which the output is coupled, and to provide an offset threshold for immunity against background noise.

Operationally, the timing recovery is based on a digital phase locked loop in which data transitions are compared with synchronous timing signals, with clock phase adjustments being continuously made to minimize the time difference between the two signals, i.e., to compensate for any phase error or bit shift in the incoming data.

The output of comparator 202 is differentiated by differentiator 204, the output of which differentiator is used to trigger a one-shot monostable multivibrator 206 having a period of three-quarters of a bit period (600 nanoseconds). The trigger pulses for digital one-shot 206 are coincident with the detected zero-crossings, while the pulse duration of the digital one-shot output is sufficient to blank out the insignificant transitions of the Manchester encoded data. The repeater clock, a 20 MHz local oscillator 208, is independently counted down to derive a 1.25 MHz synchronous timing clock, which synch clock is coupled to a synch counter 210, which includes a divide-by-sixteen circuit and an associated count control circuit 212, which count control circuit comprises a flip-flop, the operation of which will be explained hereinafter. The data (the edges of the digital one-shot 206 output pulses) and the synchronous clock frequency (the timing pulses from synch counter 210) are compared by starting a difference counter 214 with the leading edge of the digital one-shot 206 output pulses and stopping the count of difference counter 214 with the leading edge of the synchronous clock pulses. The difference counter 214 provides a digital count which corresponds to the peak shift or phase error of the data with respect to the clock. Stated differently, the difference counter output corresponds to the undesired variation in location of the data signal transition points in time. The difference counter output is sampled to determine the number of 20 MHz clock pulses that occurred between the two aforementioned leading edges by sample gates 216 and 218. If the difference (the number of counted 20 MHz clock pulses) is less than two counts (50–100 nanoseconds) no correction is made to the synch counter 210. If, however, the pulse count is greater than two, but less than eight counts (100–400 nanoseconds), an extra pulse is added to the synch counter 210 by add-subtract logic 220, which resets flip-flop 212 to add the additional pulse via a digital feedback loop 222, effectively advancing the synch clock edge by 50 nanoseconds. If the difference count is greater than eight counts (400 nanoseconds), sampling gate 218 actuates the add-substract logic 220, a series of NAND gates, to subtract a pulse from the synch counter 210 by preventing flip-flop 212 from resetting for one pulse, effectively slowing the synch clock edge by 50 nanoseconds. The aforedescribed technique continuously maintains the difference counter output at a value less than two counts of the 20 MHz clock. The maximum possible error, represented by the difference between leading edges is 400 nanoseconds for the case in which the synch clock and data signal are 180° out of phase. This would require eight bit periods to minimize the differential between the respective leasing edges to resynchronize the retimning clock which equals 400 divided by 50 nanoseconds (the clock pulse width). The synch counter 210 output at 1.25 MHz, as previously described, is coupled to the difference counter 214. Another signal counter 210 having an output at 2.5 MHz is coupled to the data retiming circuit 224, which effectively clocks the data output from comparator 202, at the retimed clock rate, to transmitter 128, wherein the data is level converted and transformer coupled to the communications lien for transmission to the data terminals.

Referring now to the waveform diagrams of FIGS. 3(A) through 3(H), the various waveforms generated in adding a pulse to the synch counter 210 are illustrated. The waveform diagrams of FIGS. 4(A) through 4(H) illustrate the waveforms generated in the course of substracting a pulse from the synch counter 210.

Considering first the addition process, FIG. 3(B) shows the output of digital one-shot 206. The leading edge of the first digital one-shot output pulse, indicated on FIG. 3(B), is shown as 175 nanoseconds out of synch with the leading edge of the 1.25 MHz synch counter, as shown by FIG. 3(H), with the two leading edges being identified by the dotted line connected therebetween. This results in a condition wherein more than two of the 20 MHz clock pulses of FIG. 2(A) are counted by the difference counter 214 (as can be seen, three clock pulses are counted). This enables the count-two circuit 216 to generate the first pulse shown by FIG. 3(C), which pulse is generated whenever more than two 20 MHz clock pulses are counted, and a signal to the add portion of add-subtract logic 220, shown by FIG. 2(D) is generated by the count-two circuit 216 which causes an extra pulse to be inserted into the synch counter drive shown by FIG. 3(E), which synch drive is divided by two as shown by FIG. 3(F) and which signal toggles a flip-flop in the data retime circuit 224 to advance the retime clock by 50 nanoseconds as shown by FIG. 3(G). The second leading edge of the one-shot output, as indicated by the dotted line between the second leading edge of FIG. 3(B) and the second leading edge of the synch counter of FIG. 3(H), is still 125 nanoseconds out of synch; hence, the aforedescribed process is repeated, with a second extra pulse indicated as such in FIG. 3(E) again advancing the retime clock by another 50 nanoseconds. The next leading edge of the one-shot is now 75 nanoseconds out of synch with the synch clock of FIG. 3(H), and a third extra pulse is added as indicated in FIG. 3(E) by the setting of the count two circuit, as shown by the third pulse of FIG. 3(C). As is apparent, the retime clock is gradually brought into synch with the data transitions until no further correction (advancing of the synch clock) is required.

Figure 3:
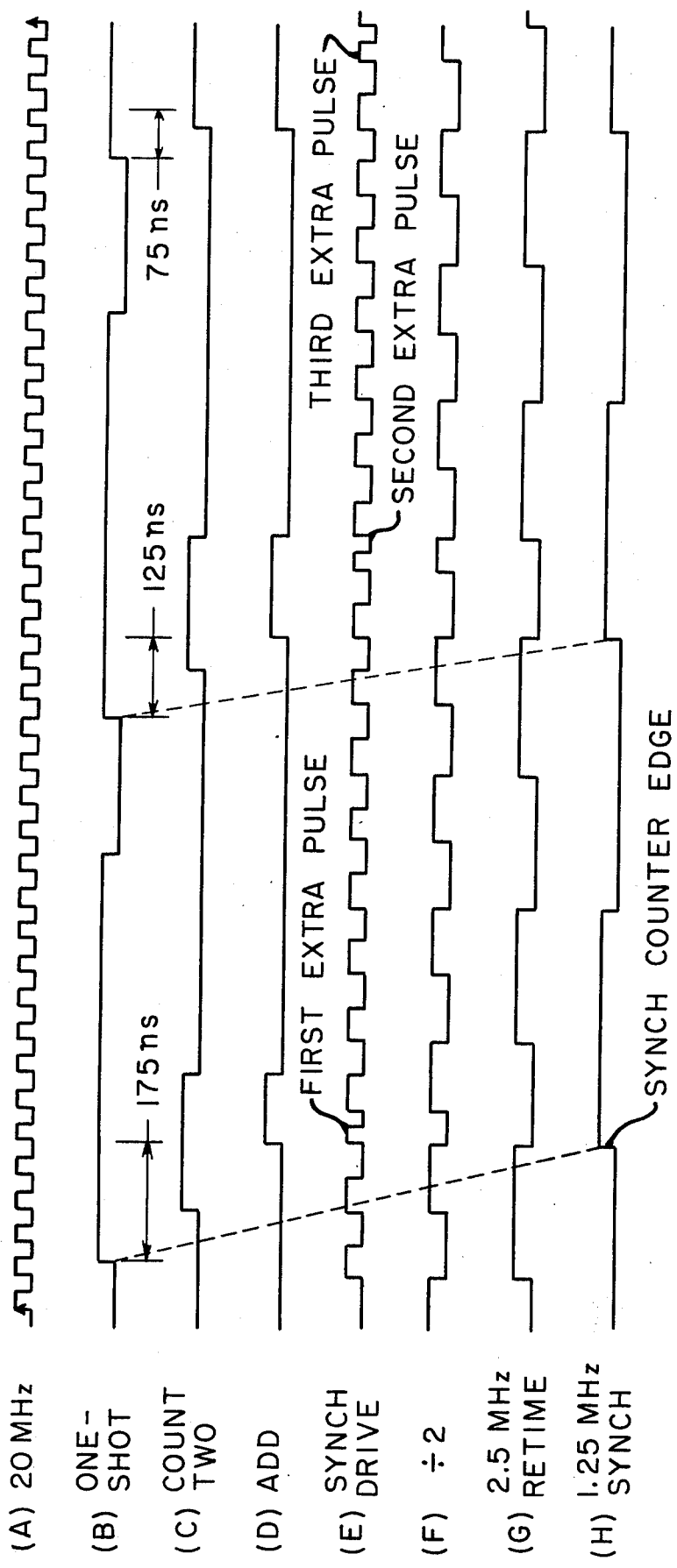
FIGS. 3(A) through 3(H) are various waveform diagrams illustrative of the retiming operation of the retiming circuit described with reference to FIG. 2 wherein the retiming clock phase is advanced.

Considering next the substracting process, reference is made to the waveforms of FIGS. 4(A) through 4(E), which waveforms, except as otherwise noted, correspond to the outputs of the same circuit elements described with reference to FIG. 3. The first leading edge of the digital one-shot 206 output, shown by FIG. 4(B), turns difference counter 214 ON and is more than eight 20 MHz counts out of synch with the next synch counter pulse leading edge, as shown by FIG. 4(H) with the two leading edges being illustrated by the dotted line therebetween. As is apparent, thirteen 20 MHz pulses are counted, indicating a 175 nanosecond leading phase error. The "greater than a count of eight" circuit 218 is set and generates the pulse train shown by FIG. 4(C), which in turn inhibits flip-flop 212 with the subtract pulse of FIG. 4(D) to modify the synch drive of 4(E) as shown. After division by two in the retime circuit 225, the retime clock of FIG. 4(G) and the synch drive of FIG. 4(H) are slowed by 50 nanoseconds, as indicated by the new 125 nanosecond synch error of the next one-shot leading edge shown at FIG. 4(B), which also illustrates an additional correction to said second one-shot pulse exactly as aforedescribed, resulting in the illustrated third one-shot output pulse of FIG. 4(B) being only 75 nanoseconds out of synch. Of course, once an error of less than 50 nanoseconds (two 20 MHz clock pulses) is realized, no further correction is made unless the data and synch clock should again move out of synchronization.

Referring now to FIG. 6, a suitable equalizer 200 and differential comparator 202 are shown schematically. Data signals are transformer coupled via transformer 302 from the communications line, are buffered by a transistor emitter follower 304, filtered and amplitude equalized by band pass filter 306. Voltage protective diodes 308 and 310 protect comparator 312 from excessive input voltages. As aforementioned, the input to comparator 312 is biased as indicated to provide an offset threshold against noise. The zero volt reference of differential comparator 312 is grounded, providing the zero-crossing detection of the bi-polar input thereto and an output signal which is coupled out via line 314 to the differentiator 204 and data retimer 224.

Figure 5A:
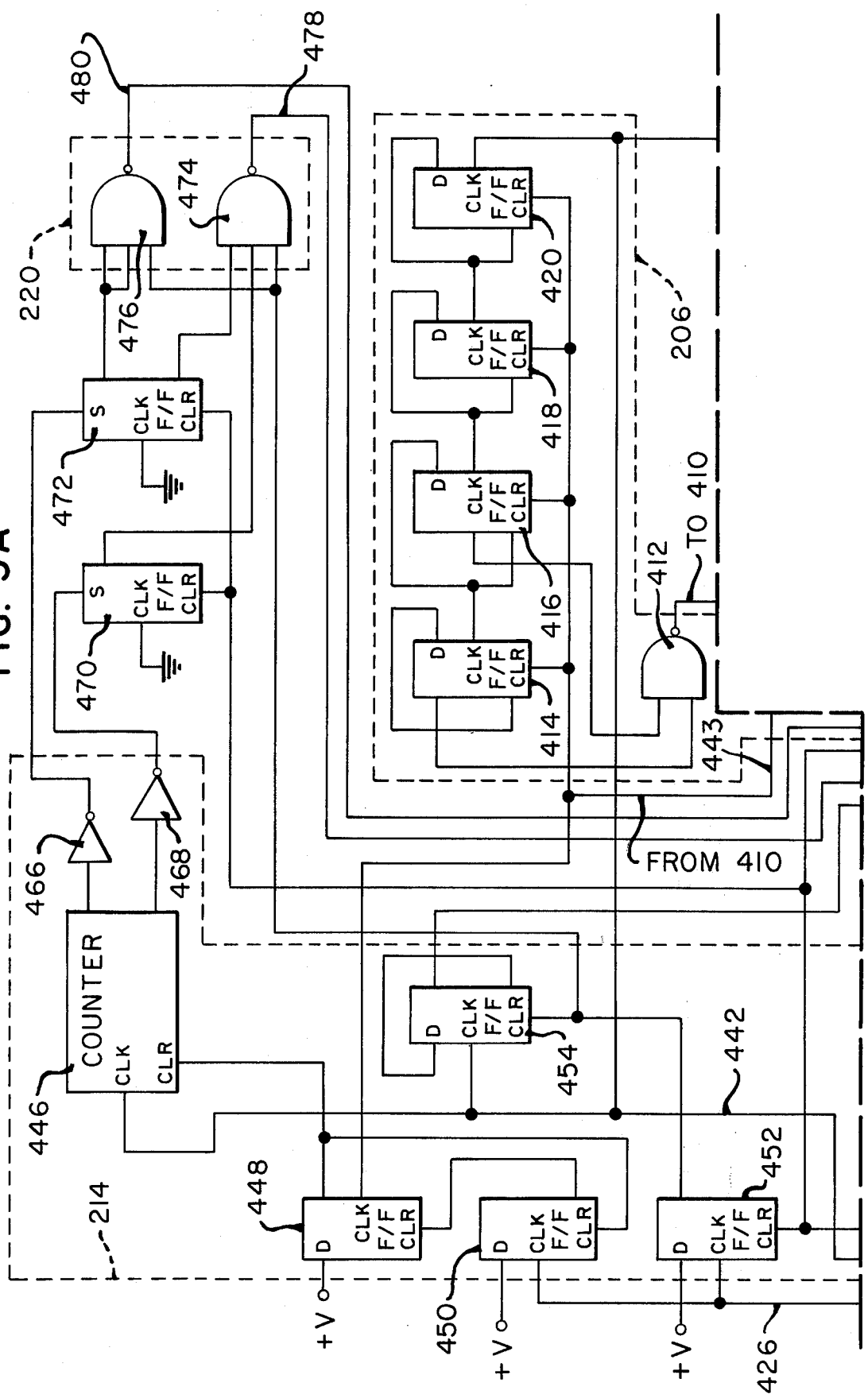
FIGS. 5(A) and 5(B) is a single logic diagram showing the circuit described with reference to FIG. 2 in greater detail.
Figure 5B:
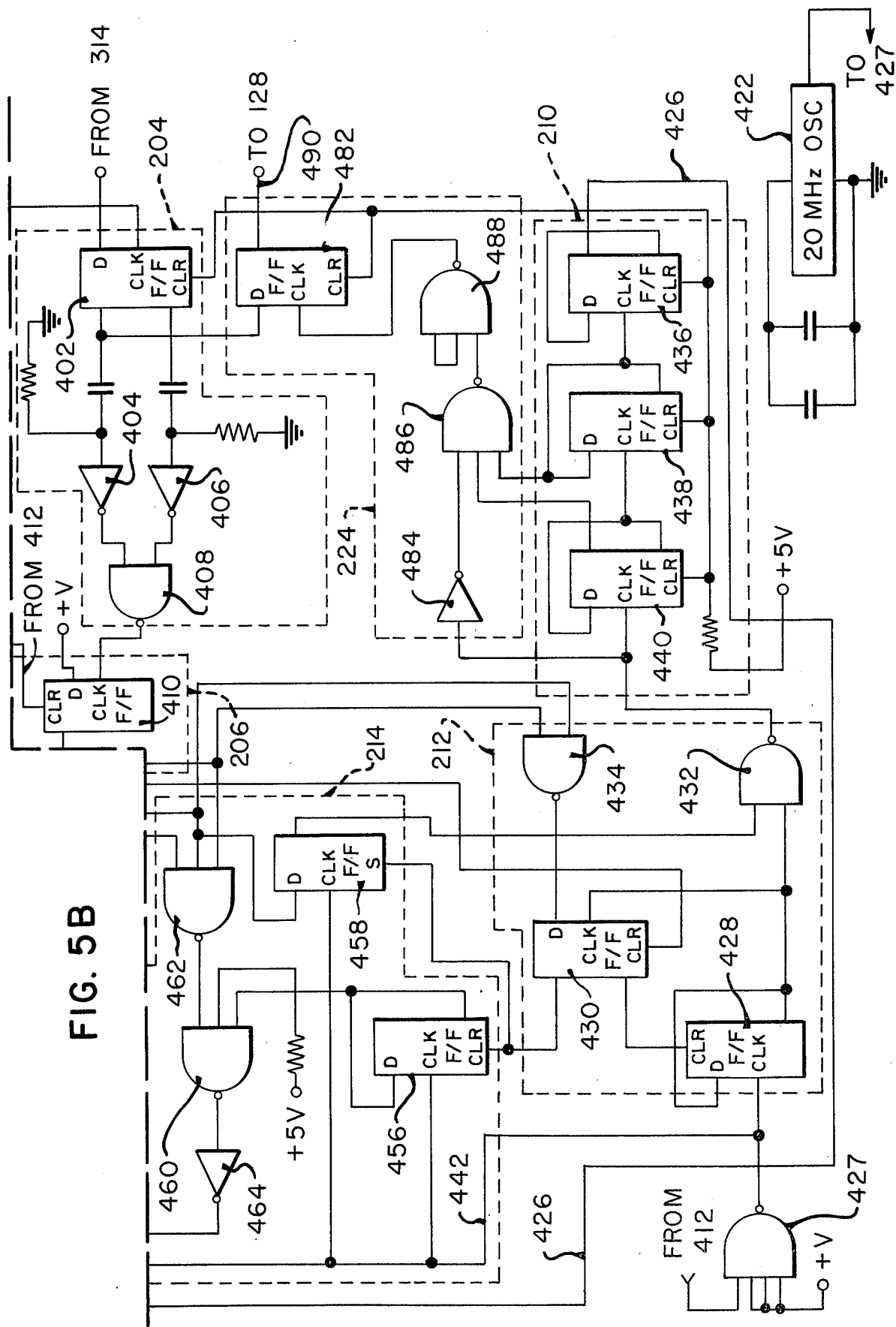

Referring now to FIGS. 5(A) and 5(B), a suitable detailed logical implementation of the invention described with reference to FIG. 2 is described. The two figures comprise a single schematic interconnected at the heavy dotted lines thereon. It is to be understood that other equivalent logical implementations may be designed, and the illustrated schematic is exemplary of one such implementation. The comparator output on line 314 is coupled to differentiator 204, which consists of a dual-D flip-flop 402 having a pair of complementary outputs which are coupled to a pair to hex inverters 404 and 406, respectively, the outputs of which hex inverters are the two inputs to a quad 2-input NAND gate 408. The output of NAND gate 408 triggers the three-quarter bit digital one-shot 206, which one-shot is comprised of a dual-D flip-flop 410 to which the differentiated NAND gate 408 output is coupled, and having as the clock input thereto the output of quad 2-input NAND gate 412. Four additional dual-D flip-flops 414, 416, 418 and 420 provide the 600 nanosecond time out and serve as the inputs to NAND gate 412, while the reset input to the four additional flip-flop is provided by the output of flip-flop 410. A 20 MHz oscillator 422 is coupled to the difference counter 214 via a buffer NAND gate 427 and to the count control 212 and synchronous counter 210 via line 442 wherein the 20 MHz clock is counted down to generate the 1.25 MHz clock. The count control 212 is comprised of a pair of dual-D flip-flops 428 and 430 and a pair of quad 2-input NAND gates 432 and 434. The synchronous counter comprises three dual-D flip-flops 436, 438 and 440. The one-shot output pulse edges and the synch clock edges are compared, as aforementioned, by starting the difference counter 214 with the one-shot output leading edges and stopping the count with the synch count leading edges. The difference counter 214 has the aforementioned outputs coupled thereto via lines 443 and 426.

Difference counter 214 comprises a synchronous 4-bit counter 446, such as Fairchild Semiconductor Co. part No. 94516. Counter gating is provided by a series of dual-D flip-flops 448 and 450 and count control 212 gating is provided by flip-flops 452, 454, 456 and 458, with the outputs of flip-flops 456 and 458 being inverted and NAND'ed by a pair of 4-input inverting NAND gates 460 and 462, the output of which NAND gates is again inverted by hex inverter 464 before being coupled to flip-flop 452. The difference count outputs from counter 446 are inverted by hex-inverters 466 and 468, with the output of hex inverter 468 being applied to the "count of two circuit", 216 of FIG. 2, which comprises a dual-D flip-flop 470; and with the output of hex inverter 466 being applied to the "count of eight circuit", 218 of FIG. 2, which also comprises a dual-D flip-flop 472.

The "set-2" output of flip-flop 470 is coupled to the pulse addition portion of add-subtract logic 220 while the "set-8" output of flip-flop 472 is coupled to the pulse subtracting portion of add-subtract logic 220. Add-subtract logic 220 comprises a pair of inverting NAND gates 474 and 476, with NAND gate 474 coupling an output pulse on line 478 when a pulse is to be added to the 10 MHz synch drive and NAND gate 476 coupling an output pulse on line 480 when a pulse is to be subtracted from the 20 MHz clock. The "add a pulse" signal on line 478 is fed back to the count control and serves as one input to NAND gate 462, while the "subtract a pulse" signal on line 480 is fed back to the count control and serves as another input to NAND gate 462, which causes the subtracting inhibit pulse to be generated, the addition reset pulse to be generated, or, when receiving no correction pulses, insures that the 10 MHz synch drive clock is unchanged.

The 2.5 MHz retiming clock output form the synch counter 210 is coupled to the data retiming circuit 224 after being generated and divided down to 1.25 MHz. The data retiming circuit 224 comprises a dual-D flip-flop 482, with input gating provided by a hex inverter 484 and a pair of NAND gates 486 and 488. The outputs of synch counter flip-flops 440 and 438 are coupled respectively to the inputs of inverter 484 and NAND gate 486, which NAND gate 486 also has coupled thereto another output from flip-flop 440 which serves as the means for decoding the data retiming pulses. The 1.25 MHz data is coupled to flip-flop 482 and timed by the retiming clock out of the retiming circuit flip-flop 482 via line 490 to the transmitter 128.

Figure 7:
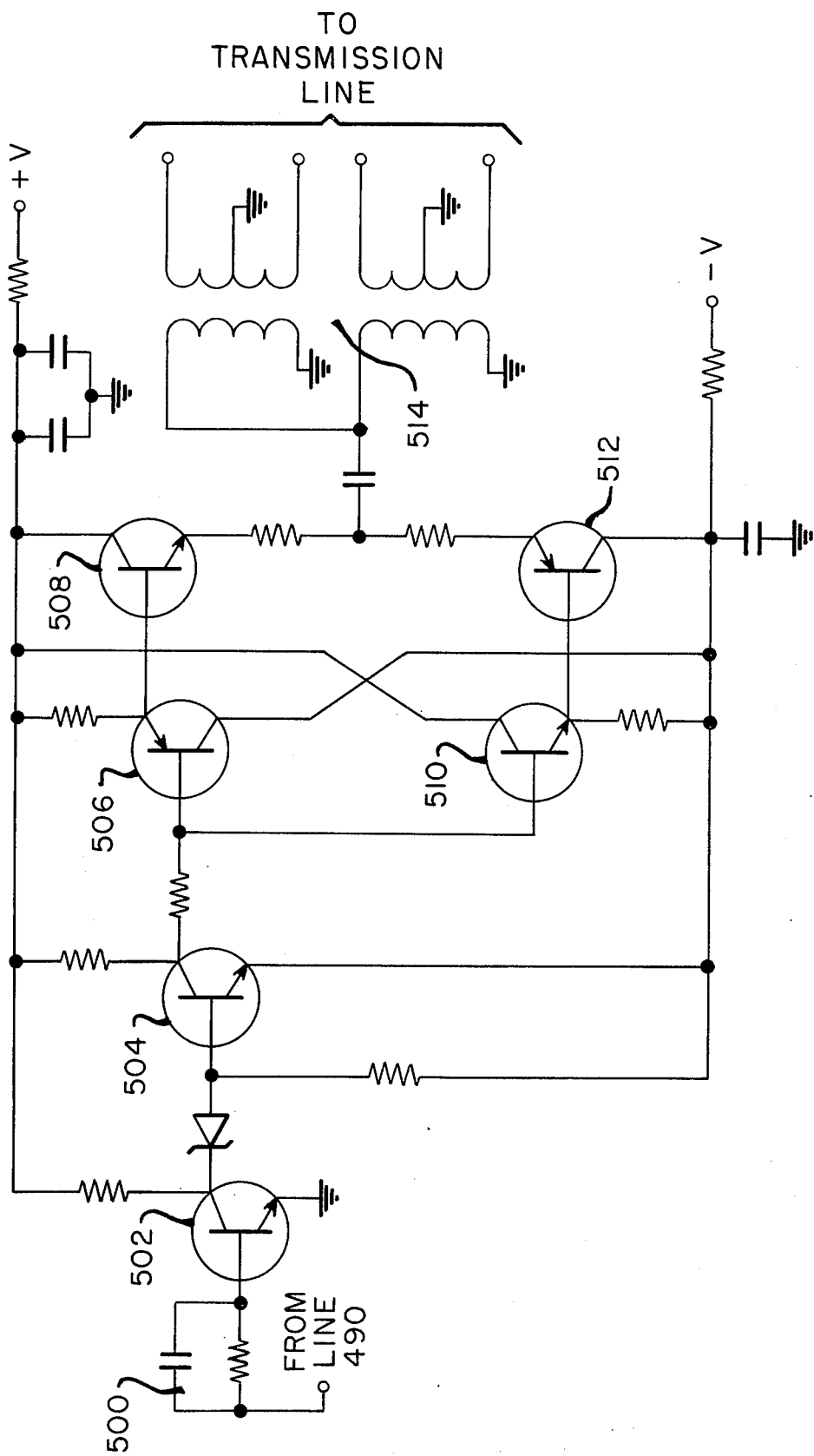
FIG. 7 is a schematic diagram of a transmitter utilized in connection with the invention.

Referring now to FIG. 7, a transmitter 128 suitable for retransmission of the retimed data from data retimer 224 onto a transmission line is illustrated. Incoming retimed data is input biased by network 500, level converted by a transmitter amplifier consisting of transistors 502 and 504 and coupled to a pair of transmitter drivers consisting of transistors 506 and 508; and 510 and 512, respectively. The level converted data is transformer coupled to communication line of up to 1200 feet between the transmitter and the terminals to which the line is coupled by transformer 514. Biasing for the drivers is provided in conventional manner by the resistive networks as illustrated.

While the invention has been shown and described with reference to a preferred embodiment thereof, it will be understood that persons skilled in the art may make modifications thereto without departing from the spirit and scope of the invention as defined by the claims appended hereto.

What is claimed is:
1. A digital phase lock loop circuit for synchronizing bit-shifted data with a retiming clock signal comprising:
    means for detecting data transitions in said bit-shifted data and for generating an output data clocking signal in response thereto;
    means for deriving a synchronous retiming clock signal;
    for comparing said output data clocking signal with said synchronous retiming clock signal for deriving a digital count signal indicative of the phase shift of said output signal with respect to said synchronous clock signal; and
    means responsive to said digital count signal for continuously digitally adjusting the phase of said retiming clock signal incrementally such that said output data clocking signal and said retiming clock signal are brought into synchronization.

2. A digital phase lock loop circuit in accordance with claim 1 wherein said means for adjusting the phase of said retiming clock signal includes means for reducing the phase difference between said retiming clock frequency and said output data clocking signal by an incremental amount whenever said phase difference exceeds a predetermined digital count, such that the phase of said output data clocking signal and said retiming clock signal are brought into synchronization.

3. A digital phase lock loop circuit in accordance with claim 1 further comprising:
    means for retransmitting said data with said output data clocking signal.

4. A digital phase lock loop circuit in accordance with claim 1, further comprising means for synchronously coupling said data to said transmission line and means for synchronously retransmitting said data from said retransmitting means onto said transmission line.

5. A digital phase lock loop circuit in accordance with claim 4 wherein said data is phase encoded data.

6. A digital phase lock loop circuit in accordance with claim 5 further comprising:

means for blanking the insignificant transitions of said phase encoded data.

7. A digital phase lock loop circuit in accordance with claim 2 wherein said means for detecting said data transitions includes a zero-crossing detector.

8. A digital phase lock loop circuit in accordance with claim 7 wherein said zero-crossing detector includes a differentiating comparator having a pulsed output coincident with said data transitions; and a non-retriggerable digital one-shot circuit triggered by said differentiating comparator output and having an output pulse width sufficient to blank said insignificant transitions.

9. A digital phase lock loop circuit in accordance with claim 2 wherein said comparing means for deriving said digital count comprises:
a difference counter for deriving a digital count signal indicative the interval between the leading edges of said output data clocking signal and said retiming clock frequency; and
sampling means for continuously monitoring said digital count signal.

10. A digital phase lock loop circuit in accordance with claim 9 further comprising:
local oscillator means for generating a pulsed signal havng a frequency substantially greater than said clock frequency; and
count control means for coupling said pulsed signal to said difference counter such that said digital count signal is the number pulses of said pulsed signal which occur during said interval between the leading edges of said output signal and said clock frequency.

11. A digital phase lock loop circuit in accordance with claim 10 wherein said means responsive to said digital count comprises:
logic means responsive to the output of said sampling means and coupled to said count control means for adding a correction pulse to the clock frequency to advance the phase thereof when said digital count signal exceeds a first predetermined value, for subtracting a correction pulse from the clock frequency to retard the phase thereof when the digital count signal is less than a second predetermined value, and for neither adding nor subtracting a correction pulse to the clock frequency when said digital count signal is less than a third predetermined value.

12. A digital phase lock loop circuit in accordance with claim 11 wherein said incremental amount by which the phase difference between said retiming clock and said output data clocking signal is adjusted is repeated for each sampling interval until said digital count signal is less than said third predetermined value.

13. A digital timing recovery circuit for synchronizing bit-shifted data with a retiming clock comprising:
means for detecting data transitions in said bit-shifted data and for generating a pulsed output data clocking signal in response thereto;
means for generating a synchronous retiming clock;
means for comparing said output data clocking signal with said retiming clock for deriving a digital count signal indicative of the phase-shift of said output data clocking signal with respect to said retiming clock; and
means responsive to said digital count signal for continuously digitally adjusting the phase of said retiming clock such that said output data clocking signal and said retiming clock are incrementally brought into synchronization with each other.

14. A digital timing recovery circuit in accordance with claim 13 wherein said means for adjusting the phase of said retiming clock includes means for incrementally reducing the phase difference between said clock frequency and said output signal over a plurality of cycles of said retiming clock whenever said phase difference exceeds a predetermined amount.

15. A digital timing recovery circuit in accordance with claim 14 further comprising:
means for retransmitting said data with said phase adjusted retiming clock.

16. A digital timing recovery circuit in accordance with claim 15 wherein said data is phase encoded data and further comprising:
means for blanking the insignificant transitions of said phase encoded data.

17. A digital timing recovery circuit in accordance with claim 14 wherein said comparing means for deriving said digital count comprises:
a difference counter for deriving a digital count signal indicative of the interval between the leading edges of said data clocking signal and said retiming clock; and
sampling means for continuously monitoring said digital count signal.

18. A digital timing recovery circuit in accordance with claim 7 further comprising:
local oscillator means for generating a pulsed signal having a frequency substantially greater than said retiming clock frequency; and
count control means responsive to said sampling means for coupling said pulsed signal to said difference counter such that said digital count signal is the number pulses of said pulsed signal which occur during said interval between the leading edges of said output signal and said clock frequency.

19. A digital timing recovery circuit in accordance with claim 18 wherein said means responsive to said digital count comprises:
logic means responsive to the output of said sampling means and coupled to said count control means for adding a correction pulse to the retiming clock to advance the phase thereof when said digital count signal exceeds a first predetermined value, for subtracting a correction pulse from the retiming clock to retard the phase thereof when the digital count signal is less than a second predetermined value, and for neither adding nor subtracting a correction pulse to the clock frequency when said digital count signal is less than a third predetermined value.

20. A digital repeater for insertion into a data transmission line for synchronously receiving data from a data source, retiming the received data with a newly generated retiming clock, and retransmitting the retimed data onto the transmission line to one or more data utilization means, comprising:
a receiver for detecting said data and for deriving a receiver output signal indicative thereof;
means for generating a retiming clock;
a digital phase lock loop retiming circuit for comparing said receiver output signal and said retiming clock for deriving a digital error signal indicative to the phase shift of said receiver output signal with respect to said retiming clock;

means responsive to said digital signal for synchronizing said receiver output signal and said retiming clock with each other by incrementally reducing the phase difference therebetween over a number of cycles of said retiming clock, said number of cycles being proportional to said digital error signal; and a transmitter for retransmitting said retimed data onto the transmission line, such that the transmission line distance over which said data is transmitted is extended.

21. A digital repeater in accordance with claim 20 wherein said data source includes a computer and wherein said data utilization means comprises a plurality of data terminals, each independently responsive to data coupled thereto from said computer.

22. A digital repeater in accordance with claim 20 wherein said synchronizing means actuates said incremental phase reduction between said retiming clock frequency and said receiver output signal whenever the phase difference therebetween exceeds a predetermined amount.

23. A digital repeater in accordance with claim 22 wherein said data is synchronously coupled to said detecting means on a transmission line and synchronously retransmitted from said retransmitting means onto a transmission line.

24. A digital repeater in accordance with claim 23 wherein said data is phase encoded data.

25. A digital repeater in accordance with claim 24 further comprising:
means for blanking the insignificant transitions of said phase encoded data.

26. A digital repeater in accordance with claim 25 wherein said means for detecting said data transitions includes a zero-crossing detector.

27. A digital repeater in accordance with claim 26 wherein said zero-crossing detector includes a differentiating comparator having a pulsed output coincident with said data transitions; and a non-retriggerably digital one-shot circuit triggered by said differentiating comparator output and having an output pulse width sufficient to blank said insignificant transitions.

28. A digitial repeater in accordance with claim 27 wherein said means for deriving said digital count comprises:
a difference counter for deriving a digital count signal indicative the interval between the leading edges of said receiver output signal and said retiming clock frequency; and
sampling means for continuously monitoring said digital count signal over sampling intervals corresponding to the intervals between said leading edges and having an output.

29. A digital repeater in accordance with claim 28 further comprising:
local oscillator means for generating a pulsed signal having a frequency substantially greater than said retiming clock frequency; and
count control means for coupling said pulsed signal to said difference counter such that said digital count signal is the number pulses of said pulsed signal which occur during said interval between the leading edges of said receiver output signal and said retiming clock.

30. A digital repeater in accordance with claim 29 wherein said means responsive to said digital count comprises:

logic means responsive to the output of said sampling means and coupled to said count control means for adding a correction pulse to the retiming clock to advance the phase thereof when said digital count signal exceeds a first predetermined value, for subtracting a correction pulse from the retiming clock to retard the phase thereof when the digital count signal is less than a second predetermined value, and for neither adding nor subtracting a correction pulse to the retiming clock when said digital count signal is less than a third predetermined value, over a number of sampling intervals sufficient to incrementally reduce said phase difference to a value corresponding to a digital count less than said third predetermined value.

31. In a data communications system for transmitting digitally encoded data between a data processor and a plurality of peripheral devices over an extended length transmission line, including one or more timing recovery circuits at one or more locations along the transmission line, each of said timing recovery circuits comprising:
means for deriving a pulsed signal indicative of transitions in said data;
means for generating a retiming clock at a frequency suitable for retransmission of said data;
means for comparing the phase of said pulsed signal and said retiming clock for deriving a digital count indicative of the phase difference therebetween; and
means responsive to said digital count for continuously and incrementally modifying the retiming clock phase such that said retiming clock is maintained in synchronization with said retransmitted data.

32. In a data communications system in accordance with claim 31 wherein said means for modifying the phase of said retiming clock includes means for reducing the phase difference by a fixed amount between said retiming clock frequency and said pulsed signal whenever said phase difference is in excess of a predetermined value.

33. In a data communications system in accordance with claim 31 further comprising:
means at each of said repeaters for retransmitting said data with said retiming clock.

34. In a data communications system in accordance with claim 33 wherein said data is synchronously received and coupled from said transmission line and synchronously retransmitted from said retransmitting means onto said transmission line.

35. In a data communications system in accordance with claim 34 wherein said data is phase encoded data.

36. In a data communications system in accordance with claim 35 further comprising:
means for blanking the insignificant transitions of said phase encoded data.

37. In a data communications system in accordance with claim 36 wherein said means for detecting said data transitions includes a zero-crossing detector.

38. In a data communications system in accordance with claim 37 wherein said zero-crossing detector includes a differentiating comparator having a pulsed output coincident with said data transitions; and a non-retriggerable digital one-shot circuit triggered by said differentiating comparator output and having an output pulse width sufficient to blank said insignificant transitions.

39. In a data communications system in accordance with claim 38 wherein said comparing means for deriving said digital count comprises:
- a difference counter for deriving a digital count signal indicative of the interval between the leading edges of said pulsed signal and said retiming clock; and
- sampling means to continuously monitor said digital count signal occurring during said interval and having an output during each sampling interval.

40. In a data communications system in accordance with claim 39 further comprising:
- local oscillator means for generating a high-frequency signal at a frequency substantially greater than said retiming clock frequency; and
- count control means for coupling said high-frequency signal to said difference counter such that said digital count signal is the number pulses of said high-frequency signal which occur during said sampling interval between the leading edges of said output signal and said clock frequency.

41. In a data communications system in accordance with claim 40 wherein said means responsive to said digital count comprises:
- logic means responsive to the output of said sampling means and coupled to said count control means for adding a correction pulse to the retiming clock to advance the phase thereof when said digital count signal exceeds a first predetermined value, for subtracting a correction pulse from the clock frequency to retard the phase thereof when the digital count signal is less than a second predetermined value, and for neither adding nor subtracting a correction pulse to the clock frequency when said digital count signal is less than a third predetermined value, whereby said correction pulses incrementally modify the retiming clock phase over a number of sampling intervals by a fixed amount during each interval.

42. A data communications system comprising:
- data processing means including means for coupling digitally encoded data onto a transmission line;
- modem means at least one location on the transmission line for retiming said data in accordance with a newly generated retiming clock;
- means associated with said modem means for comparing the phase of said data with the phase of said retiming clock to derive a digital phase correction signal representative to the phase difference therebetween;
- means responsive to said digital phase correction signal for continuously and incrementally modifying the phase of said retiming clock;
- means for retransmitting said data along the transmission line synchronized with said retiming clock; and
- data utilization means having said retransmitted data coupled thereto.

43. A data communications system in accordance with claim 42 wherein said means for adjusting the phase of said retiming clock includes means for reducing the phase difference between said retiming clock and said data whenever said phase difference exceeds a predetermined amount.

44. A data communications system in accordance with claim 43 wherein said data is phase encoded further comprising:
- means for blanking the insignificant transitions of said phase encoded data.

45. A data communications system in accordance with claim 44 wherein said comparing means for deriving said digital count comprises:
- a difference counter for deriving a digital count signal indicative of the interval between the leading edges of said output signal and said clock frequency; and
- sampling means continuously monitoring said digital count signal, and having an output.

46. A data communications system in accordance with claim 45 further comprising:
- local oscillator means for generating a pulsed signal having a frequency substantially greater than said retiming clock frequency; and
- count control means for coupling said pulsed signal to said difference counter such that said digital count signal is the number pulses fo said pulsed signal which occur during said interval between the leading edges of said output signal and said clock frequency.

47. A data communications system in accordance with claim 46 wherein said means responsive to said digital count comprises:
- logic means responsive to the output of said sampling means and coupled to said count control; and
- means for adding a correction pulse to the clock frequency to advance the phase thereof when said digital count signal exceeds a first predetermined value, for subtracting a correction pulse from the clock frequency to retard the phase thereof when the digital count signal is less than a second predetermined value, and for neither adding nor subtracting a correction pulse to the clock frequency when said digital count signal is less than a third predetermined value, whereby said retiming clock is progressively synchronized over a number of sampling intervals until a sampling interval occurs during which interval said digital count is less than said third predetermined value.

48. A digital circuit for synchronizing bit-shifted data with a retiming clock comprising:
- means for detecting data transitions in said bit-shifted data and for generating an output data clocking signal in response thereto;
- means for deriving a retiming a clock signal;
- means for comparing said output data clocking signal with said retiming clock signal for deriving a digital signal indicative of the phase shift of said output signal with respect to said clock signal; and
- means responsive to said digital signal for continuously adjusting the phase of said retiming clock frequency incrementally such that said output data clocking signal is synchronized to said retiming clock signal.

* * * * *

UNITED STATES PATENT OFFICE
CERTIFICATE OF CORRECTION

Patent No. 4,031,317      Dated    June 21, 1977

Inventor(s) Herbert D. McClain, et al.

It is certified that error appears in the above-identified patent and that said Letters Patent are hereby corrected as shown below:

Claim 1, line 8, before "for" insert -- means --.

Claim 27, line 4, "non-retriggerably" should be -- non-retriggerable --.

Claim 42, line 10, "to" should be -- of --.

Claim 46, line 8, "fo" should be -- of --.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks